United States Patent
Li et al.

(10) Patent No.: US 10,825,747 B2
(45) Date of Patent: Nov. 3, 2020

(54) SEMICONDUCTOR DEVICE PACKAGE AND METHODS OF MANUFACTURE THEREOF

(71) Applicant: NXP USA, INC., Austin, TX (US)

(72) Inventors: Li Li, Scottsdale, AZ (US); Jaynal A. Molla, Gilbert, AZ (US); Lakshminarayan Viswanathan, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 97 days.

(21) Appl. No.: 15/710,098

(22) Filed: Sep. 20, 2017

(65) Prior Publication Data

US 2018/0012815 A1 Jan. 11, 2018

Related U.S. Application Data

(62) Division of application No. 15/079,276, filed on Mar. 24, 2016, now Pat. No. 9,799,580.

(51) Int. Cl.
*H01L 23/34* (2006.01)
*H01L 23/047* (2006.01)
(Continued)

(52) U.S. Cl.
CPC ............ *H01L 23/047* (2013.01); *H01L 21/50* (2013.01); *H01L 21/52* (2013.01); *H01L 21/566* (2013.01);
(Continued)

(58) Field of Classification Search
CPC ............ H01L 23/3171; H01L 23/3185; H01L 23/047; H01L 23/3736; H01L 23/3732; H01L 23/3733; H01L 24/83; H01L 24/85; H01L 24/27; H01L 24/32; H01L 21/566; H01L 21/568; H01L 21/52; H01L 21/50; H01L 2021/60277; H01L 2021/603; H01L 2224/26122; H01L 2224/27848;
(Continued)

(56) References Cited

U.S. PATENT DOCUMENTS

| 4,888,307 A | 12/1989 | Spairisano et al. |
| 5,091,341 A * | 2/1992 | Asada ............ H01L 21/56 |
| | | 257/675 |

(Continued)

OTHER PUBLICATIONS

Li, J., "Bonding strength of multiple SiC die attachment prepared by sintering of Ag nanoparticles"; Journal of Material Processing Technology, 215 (2015) 299-308.
(Continued)

*Primary Examiner* — Michael M Trinh

(57) ABSTRACT

A method of manufacturing a packaged semiconductor device includes forming an assembly by placing a semiconductor die over a substrate with a die attach material between the semiconductor die and the substrate. A conformal structure which includes a pressure transmissive material contacts at least a portion of a top surface of the semiconductor die. A pressure is applied to the conformal structure and in turn, the pressure is transmitted to the top surface of the semiconductor die by the pressure transmissive material. While the pressure is applied, concurrently encapsulating the assembly with a molding compound and exposing the assembly to a temperature that is sufficient to cause the die attach material to sinter.

17 Claims, 6 Drawing Sheets

(51) Int. Cl.
*H01L 21/52* (2006.01)
*H01L 23/373* (2006.01)
*H01L 21/56* (2006.01)
*H01L 21/60* (2006.01)
*H01L 21/50* (2006.01)
*H01L 23/00* (2006.01)
*H01L 23/433* (2006.01)
*H01L 23/31* (2006.01)
H01L 21/603 (2006.01)

(52) U.S. Cl.
CPC ...... *H01L 23/3157* (2013.01); *H01L 23/3736* (2013.01); *H01L 23/4334* (2013.01); *H01L 24/29* (2013.01); *H01L 24/75* (2013.01); *H01L 24/83* (2013.01); *H01L 24/85* (2013.01); H01L 23/373 (2013.01); H01L 24/45 (2013.01); H01L 24/48 (2013.01); H01L 24/73 (2013.01); H01L 24/92 (2013.01); H01L 2021/603 (2013.01); H01L 2021/60277 (2013.01); H01L 2224/2929 (2013.01); H01L 2224/29339 (2013.01); H01L 2224/29344 (2013.01); H01L 2224/29347 (2013.01); H01L 2224/29355 (2013.01); H01L 2224/29364 (2013.01); H01L 2224/29393 (2013.01); H01L 2224/29399 (2013.01); H01L 2224/32245 (2013.01); H01L 2224/45124 (2013.01); H01L 2224/45139 (2013.01); H01L 2224/45144 (2013.01); H01L 2224/45147 (2013.01); H01L 2224/48091 (2013.01); H01L 2224/48247 (2013.01); H01L 2224/48465 (2013.01); H01L 2224/73265 (2013.01); H01L 2224/8384 (2013.01); H01L 2224/83191 (2013.01); H01L 2224/83192 (2013.01); H01L 2224/83193 (2013.01); H01L 2224/85439 (2013.01); H01L 2224/85455 (2013.01); H01L 2224/92247 (2013.01); H01L 2924/16195 (2013.01)

(58) Field of Classification Search
CPC . H01L 2224/48091; H01L 2224/83091; H01L 2224/83092; H01L 2224/83097
See application file for complete search history.

(56) References Cited

U.S. PATENT DOCUMENTS

| | | | | |
|---|---|---|---|---|
| 5,455,386 | A | * | 10/1995 | Brathwaite ............. H01L 23/10 174/522 |
| 5,622,873 | A | * | 4/1997 | Kim ....................... H01L 21/565 438/65 |
| 6,420,779 | B1 | | 7/2002 | Sharma et al. |
| 6,453,749 | B1 | * | 9/2002 | Petrovic .............. G01L 19/0069 73/754 |
| 6,921,971 | B2 | | 7/2005 | Basho et al. |
| 7,435,619 | B2 | | 10/2008 | Shim et al. |
| 7,445,967 | B2 | | 11/2008 | Abdo et al. |
| 7,901,971 | B2 | | 3/2011 | Hunziker et al. |
| 8,835,299 | B2 | | 9/2014 | Speckels et al. |
| 9,099,567 | B2 | | 8/2015 | Viswanathan et al. |
| 2004/0011699 | A1 | * | 1/2004 | Park ....................... H01L 23/055 206/710 |
| 2008/0231145 | A1 | * | 9/2008 | Nagano ................. B22F 1/0074 310/344 |
| 2013/0221511 | A1 | | 8/2013 | Higgins, III et al. |
| 2014/0070397 | A1 | * | 3/2014 | Viswanathan ...... H01L 23/3677 257/706 |
| 2014/0233086 | A1 | * | 8/2014 | Oberst .................... B81B 7/007 359/291 |
| 2015/0146399 | A1 | * | 5/2015 | Viswanathan .......... H01L 24/83 361/785 |
| 2016/0172559 | A1 | | 6/2016 | Zitzlsperger et al. |

OTHER PUBLICATIONS

Gobl, C., "Low temperature sinter technology Die attachment for power electronic applications", CIPS 2010, Nuremberg, Germany, Mar. 16-18 2010, 5 pages.

"Heraeus-Besi-Industrial Sintering Process-Brochure (2013)"; www.heraeus-electronics.com, 2016, 8 pages.

"Advanced Molding and Sintering Systems"; Boschman Technologies, www.boschman.nl, printed Mar. 23, 2016, 2 pages.

Siow, K., "Are Sintered Silver Joints Ready for Use as Interconnect Material in Microelectronic Packaging?"; Journal of Electronic Materials, vol. 43, No. 4, 2014, 15 pages.

* cited by examiner

SEMICONDUCTOR DEVICE PACKAGE AND METHODS OF MANUFACTURE THEREOF

This application is a divisional application of a U.S. patent application entitled "SEMICONDUCTOR DEVICE PACKAGE AND METHODS OF MANUFACTURE THEREOF", having a serial number of Ser. No. 15/079,276, having a filing date of Mar. 24, 2016, and issued as U.S. Pat. No. 9,799,580, having common inventors, and having a common assignee, all of which is incorporated by reference in its entirety.

BACKGROUND

Field

This disclosure relates generally to semiconductor device packaging, and more specifically, to a semiconductor device packaging capable of use with high-frequency devices.

Related Art

Fabrication of semiconductor device packaging capable of use with high-frequency devices includes attaching semiconductor die to a substrate. The substrate may include a leadframe, flange, or other substrate. Adhesive die attach methods typically use non-conductive adhesives such as polymer adhesives or epoxies as die attach material to mount the semiconductor die to the substrate. In contrast, eutectic die attach methods typically use preforms or pastes of conductive eutectic alloys including gold to bond the semiconductor die to the substrate. To meet performance targets, it may be required for high-frequency devices to include die attached to the substrate with a conductive die attach material. However, a die attach process using a gold die attach material, for example, significantly increases the cost of manufacturing high-frequency devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an efficient semiconductor device packaging process that uses film-assisted molding (FAM) to create an air cavity on top of a semiconductor die, and concurrently, provides heat and pressure for a sintering die attach process. The efficient semiconductor device packaging process enables a sintered die attach and air cavity formation in a single packaging process step.

Forming an air cavity above a semiconductor die allows for reduced signal coupling which is important for high frequency devices. Because these high frequency devices can generate a significant amount of heat, a sintered die attach is important to assist in dissipating heat away from the package. The present disclosure provides a significant advantage in concurrently forming the air cavity and sintered die attach, saving process steps, packaging cycle time, and packaging costs.

FIGS. 1-6 illustrate, in a simplified cross-sectional view, an exemplary packaged semiconductor device 100 at various stages of manufacture in accordance with an embodiment of the present disclosure.

Figure 1:
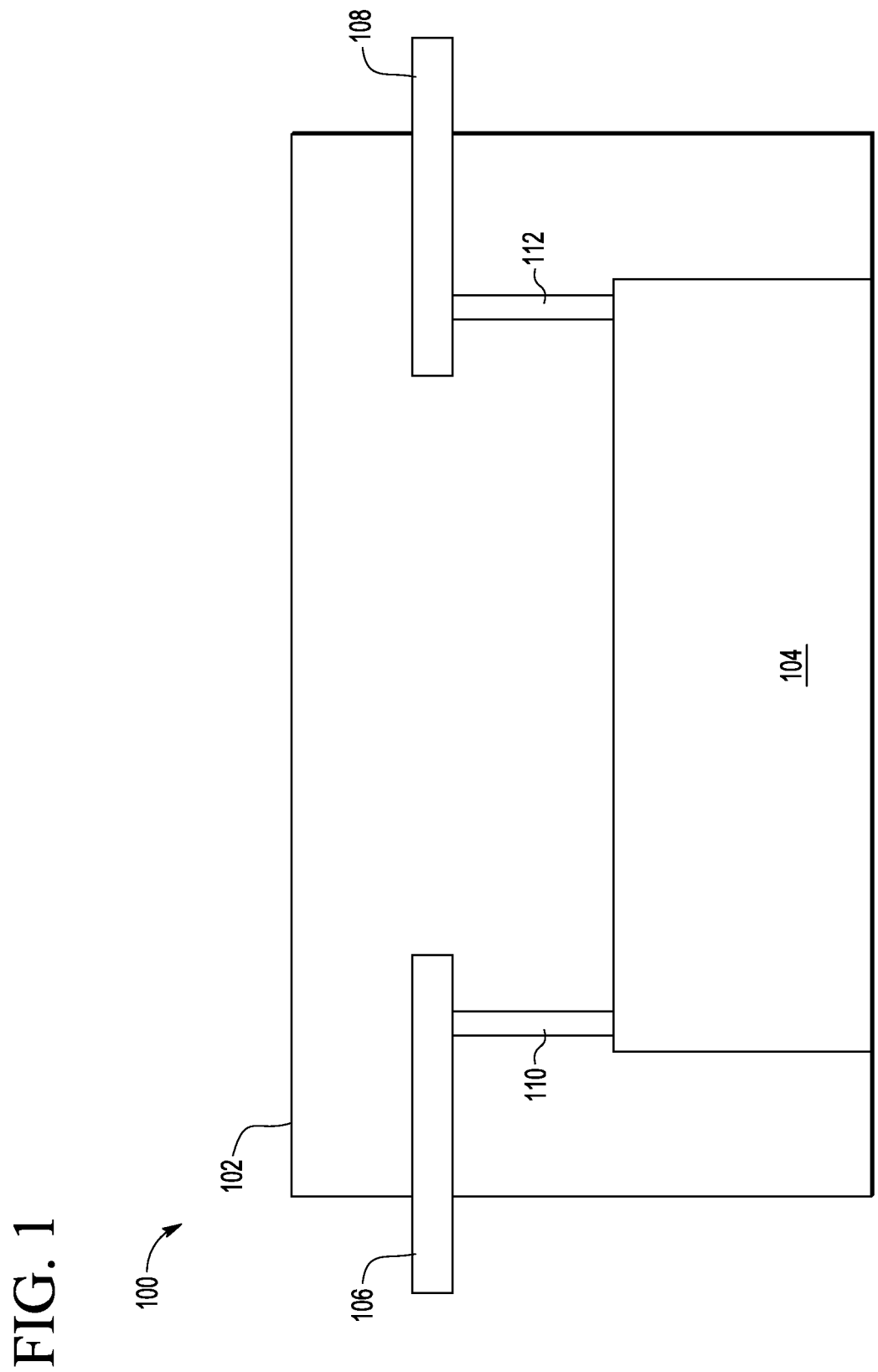
FIGS. 1-6 illustrate, in a simplified cross-sectional view, a packaged semiconductor device at various stages of manufacture in accordance with an embodiment of the present disclosure.

FIG. 1 illustrates, in a simplified cross-sectional view, a stage of manufacture of packaged semiconductor device 100, including a mold cavity 102, substrate 104, leads 106 and 108, and staking posts 110 and 112. The mold cavity 102 may be formed in any suitable tooling such as film-assisted mold (FAM) tooling for example. Mold cavity 102 may be formed in any suitable shape, for example, having at least a portion of one or more sidewalls formed at an angle to facilitate release from the mold cavity 102.

The substrate 104 may be referred to as a flange, heatsink, or other substrate, and may be configured for dissipating heat. Substrate 104 may be formed from a single, homogenous conductive material, in an embodiment. For example, substrate 104 may be formed from copper (Cu), a copper alloy, or other bulk conductive materials. Substrate 104 may be bare, or may be plated such that the top surface of the substrate may include silver (Ag), gold (Au), copper, or other conductive material, for example. Alternatively, in some embodiments, substrate 104 may be formed from an integrated combination of multiple materials, such as a bulk conductive material that is integrated with one or more other materials. For example, one or more bulk conductive materials such as copper, a copper alloy, silver, aluminum (Al), and/or other bulk materials in molten or other structural forms may be integrated with tungsten (W), molybdenum (Mo), diamond, graphite, silicon carbide (SiC), boron nitride (BN), or other materials in skeletal, particle (e.g., microscopic or macroscopic particles, fibers, flakes, or other discrete forms), or other structural forms. As a non-limiting example, a copper tungsten flange may be formed from an integrated combination of tungsten in a skeletal form with molten copper infiltrated throughout the tungsten structure. As other non-limiting examples, a copper diamond flange may be formed from an integrated combination of copper and diamond particles, a copper SiC flange may be formed from an integrated combination of copper and SiC fibers, a copper graphite flange may be formed from an integrated combination of copper and graphite flakes, and so on. In various alternate embodiments, a flange may be formed from a composite of multiple layers of conductive materials, such as Cu/Mo/Cu, Cu/MoCu/Cu, etc.

In an alternate embodiment, substrate 104 may include ceramic or organic bulk materials (e.g., standard printed circuit board (PCB) materials) with a conductive layer on the top surface of the bulk materials. Such a substrate also may include through substrate vias, embedded Cu coins, edge conductors, and/or other conductive features that facilitate electrical and/or thermal connection with the top conductive material. For example, the conductive material layer may include Cu, W, Mo, Ag, nickel (Ni), gold (Au), some combination thereof, or another suitable material. Embedded Cu coins may be formed in any shape or size and may be press-fit or inlayed into the substrate 104.

Leads 106 and 108 may be formed of any suitable conductive material, such as copper or a copper alloy for example. Leads 106 and 108 may include input leads, output leads, and input/output (I/O) leads of device 100. Leads 106 and 108 may serve other functions of device 100 as well such as supplying power, ground, control signals, or other functions for example. In the embodiment illustrated in device 100, leads 106 and 108 have a straight configuration. In some embodiments, leads 106 and 108 may have a "gull wing" or other configuration. In other alternate embodiments, a device may be housed in a pinned package (e.g., a pin grid array (PGA) package), a chip carrier package, a ball grid array (BGA) package, a surface mount package (e.g., a land grid array (LGA) package), a leadless package (e.g., a flat no-leads package such as a dual flat no-leads (DFN), quad flat no-leads (QFN), or power QFN package), or in another type of package.

Staking posts 110 and 112 provide support for leads 106 and 108 until device 100 is molded during a subsequent manufacturing step. Staking posts may include any structure formed of any suitable non-conductive material such as a dielectric material, insulating board, printed circuit board (PCB), molded pins, and the like, for example. In some embodiments, staking posts 110 and 112 may include retractable pins which can support leads 106 and 108 prior to molding, and upon molding, be retracted. Such retractable pins may be incorporated in mold tooling. In some embodiments, staking posts 110 and 112 may be formed from any suitable conductive material. For example, staking posts formed of conductive material may be used in a portion of a leadframe connected to ground, or a sacrificial lead where the lead will be trimmed off at the outside of package.

Figure 2:
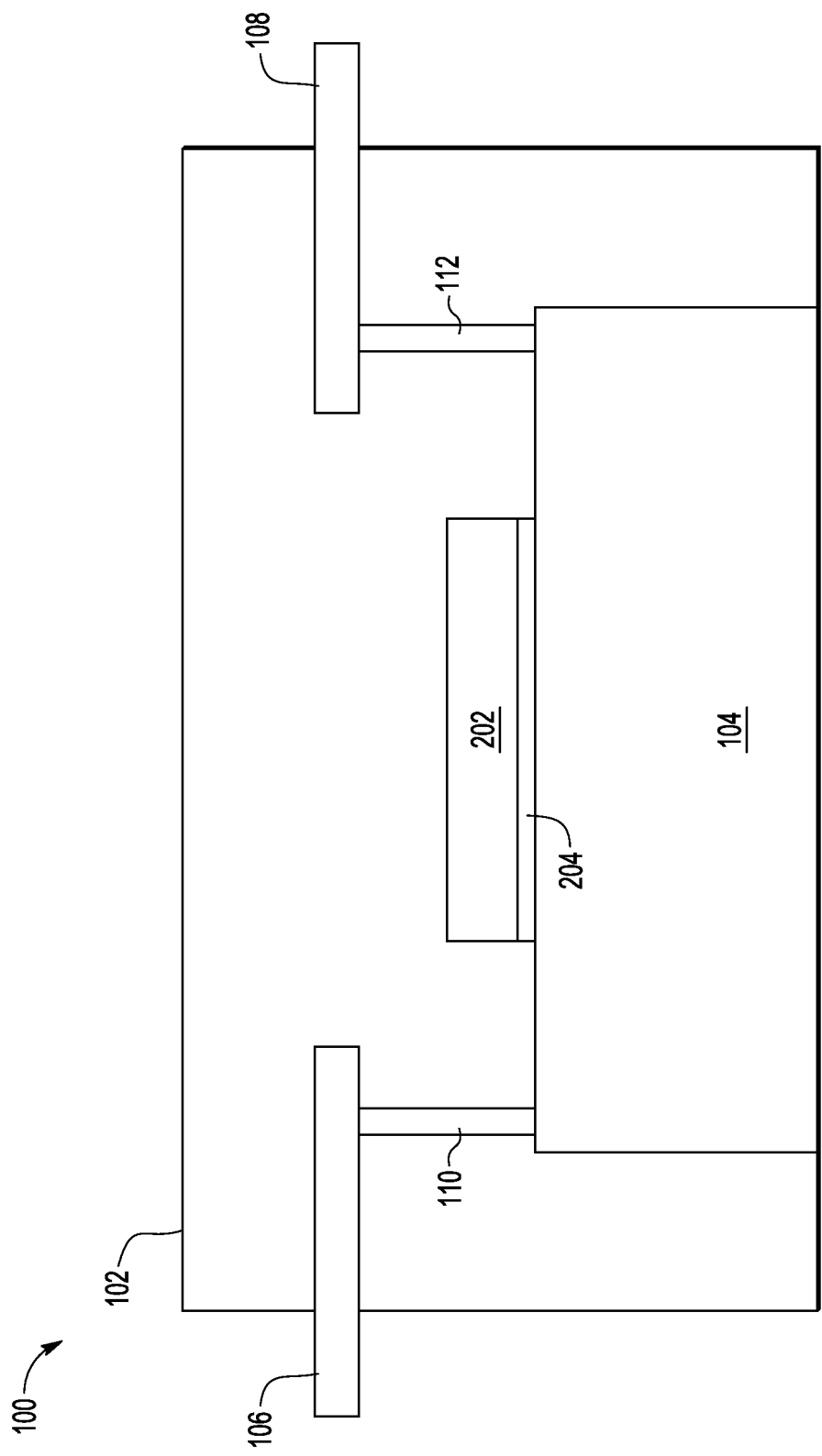

FIG. 2 illustrates, in a simplified cross-sectional view, a subsequent stage of manufacture of packaged semiconductor device 100, including a semiconductor die 202 over substrate 104. Semiconductor die 202 is placed over the substrate 104 with die attach material 204 between semiconductor die 202 and substrate 104, forming an assembly that includes semiconductor die 202, die attach material 204, substrate 104, and leads 106 and 108.

The semiconductor die 202 may be formed of any semiconductive material, such as silicon, germanium, gallium arsenide, gallium nitride and the like. Semiconductor die 202 may include any or combination of digital circuits, analog circuits, memory, processor, MEMS, sensors, and the like. The die attach material 204 is applied over the top surface of the substrate 104 at least in the areas at which semiconductor die 202 will be attached. In addition or alternatively, the die attach material 204 may be applied over the bottom surfaces of semiconductor die 202. The die attach material 204 may be in any suitable form such as a paste, a film, a preform, or other suitable form for example. The die attach material 204 includes particles of one or more metallic materials that are capable of assuming a conductive structure when exposed to conditions suitable for sintering, such as elevated temperatures. For example, the die attach material 204 may include particles of silver, gold, copper, nickel, palladium, and/or other sinterable materials configured to produce a sintered metal when exposed to a temperature sufficient for sintering to occur. The particles may have sizes in a range of about 10 nanometers (nm) to about 100 nm. In some embodiments, the particles may be smaller or larger, as well. In some embodiments, the particles may be coated with one or more materials that retard oxidation and/or prevent agglomeration of the particles prior to sintering, for example, that prevent agglomeration at non-elevated, ambient temperatures. The die attach material may include organic, or polymer material, such as a resin, to adjust the mechanical property of the die attach layer.

In addition to particles of a metallic material, die attach material 204 also may include one or more additive materials (e.g., graphene, diamond particles, silicon carbide, titanium carbide, boron nitride, or other suitable materials) that are configured to increase the thermal conductivity of the die attach material 204 during operation of the device.

Figure 3:
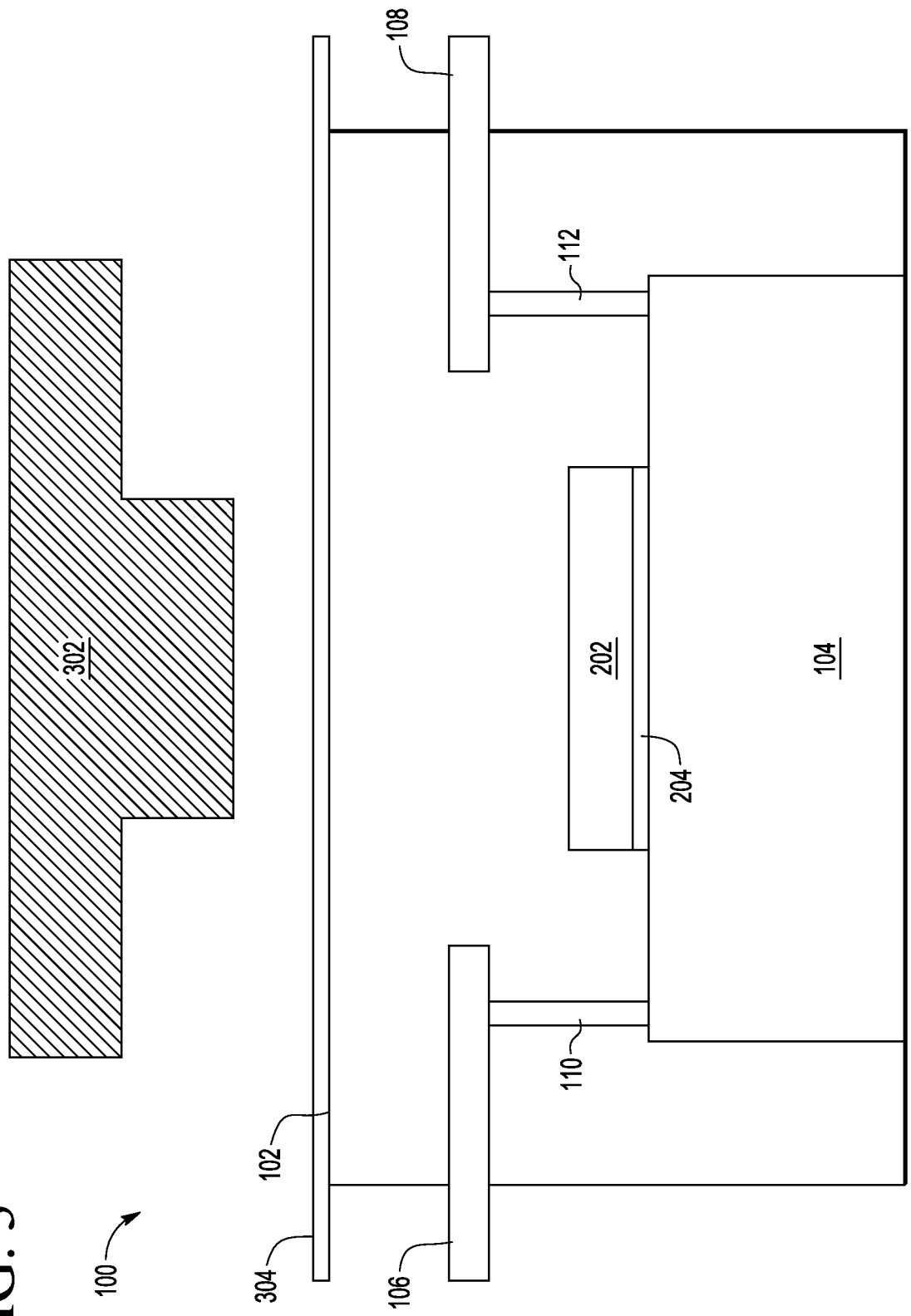

FIG. 3 illustrates, in a simplified cross-sectional view, a subsequent stage of manufacture of packaged semiconductor device 100, including film 304 positioned over mold cavity 102 along with film-assisted molding (FAM) tool 302. Film 304 is any conformal film or membrane suitable for film-assisted molding packaging. Film 304 may include adhesive and/or sealing properties and may be formed with materials such as plastic, polyester, and Teflon, for example. Film 304 is positioned over the mold cavity 102 such that in a subsequent manufacturing step, FAM tool 302 engages film 304 when FAM tool 302 is inserted into mold cavity 102. FAM tool 302 may be formed in any suitable shape, including angled, tapered, or orthogonal surfaces, for example.

Figure 4:
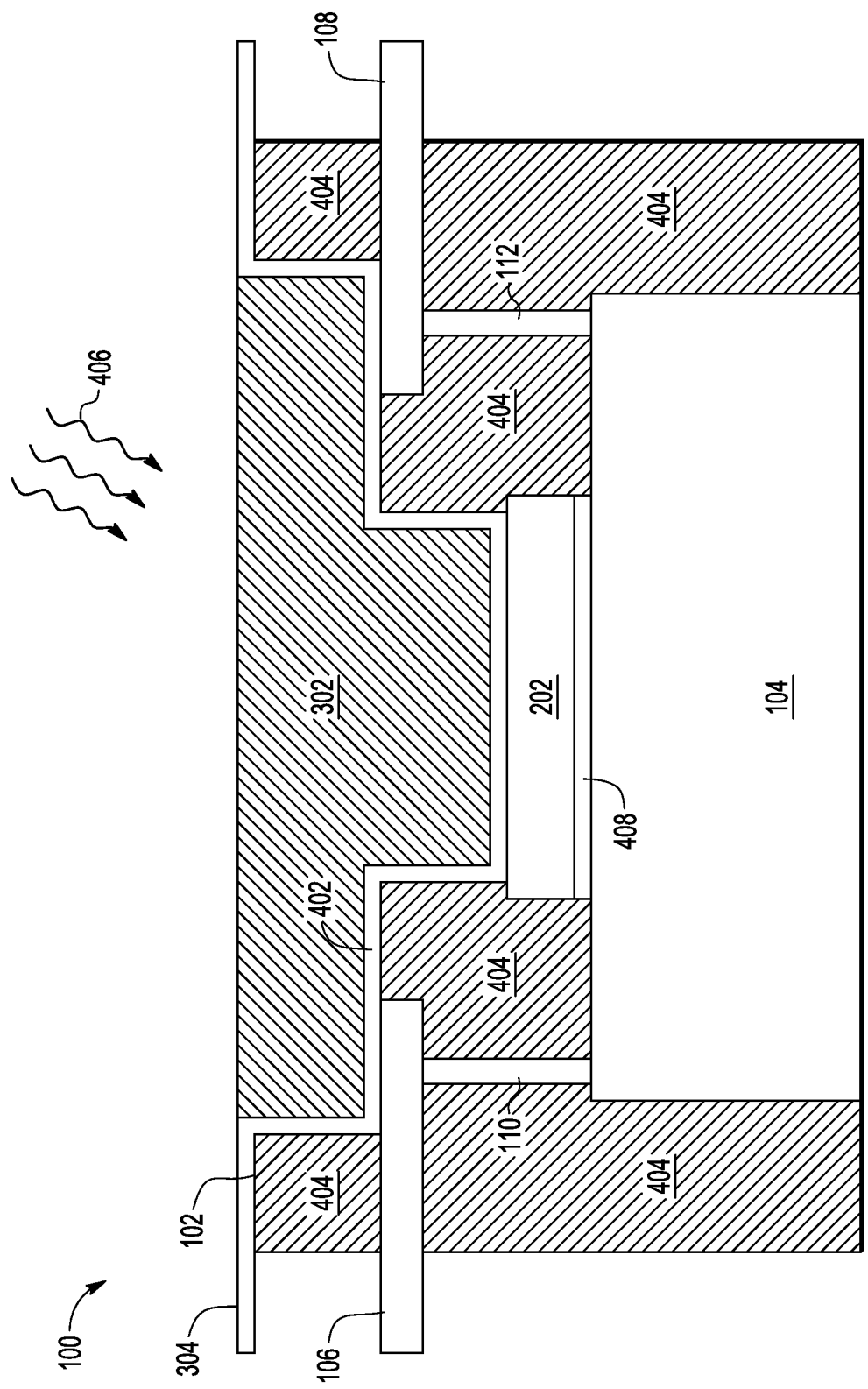

FIG. 4 illustrates, in a simplified cross-sectional view, a subsequent stage of manufacture of packaged semiconductor device 100, including encapsulated portions of the formed assembly (FIG. 2) along with sintered die attach material 408. FAM tool 302 is inserted into mold cavity 102 with the FAM tool surface contacting the film 304 causing a portion of the film to conform (402) to the FAM tool surface. In some embodiments, a vacuum may be applied to enhance conforming the portion of the film to the FAM tool surface.

With FAM tool 302 fully inserted into mold cavity 102, regions of mold cavity 102 are partitioned by conformed film portion 402 contacting portions of the formed assembly at leads 106 and 108 and semiconductor die 202. This allows for at least portions of the assembly to be encapsulated with a molding compound 404. In this embodiment, it is desired to prevent molding compound from completely covering the semiconductor die 202, and thereby forming an air cavity above the semiconductor die 202.

While FAM tool 302 is fully inserted into mold cavity 102, pressure applied to the conformed film portion 402 in turn, transmits pressure to a major surface of semiconductor die 202. In this embodiment, the die attach material 204 is sintered concurrently with molten mold compound injected into cavity partitions formed by the FAM tool 302 and conformed film portion 402. For example, heat 406 may be applied to the FAM tool 302 sufficient to cause the die attach material 204 to sinter, while molten mold compound is injected into the desired regions of mold cavity 102. In some embodiments, heat 406 sufficient to sinter the die attach material 204 may be applied in any number of ways such as applying heat to the substrate 104 in addition to or instead of applying heat to FAM tool 302. The elevated temperature of injected molten mold compound may assist sintering the die attach material 204.

Still referring to FIG. 4, forming the air cavity above the semiconductor die 202 and forming the sintered die attach material 408 are performed concurrently. For example, the steps of forming the air cavity above the semiconductor die 202 and forming the sintered die attach material 408 are performed without retracting the FAM tool 302. Because these steps are performed concurrently with the FAM tool 302 remaining inserted, manufacturing cycle times and costs are reduced.

Figure 5:
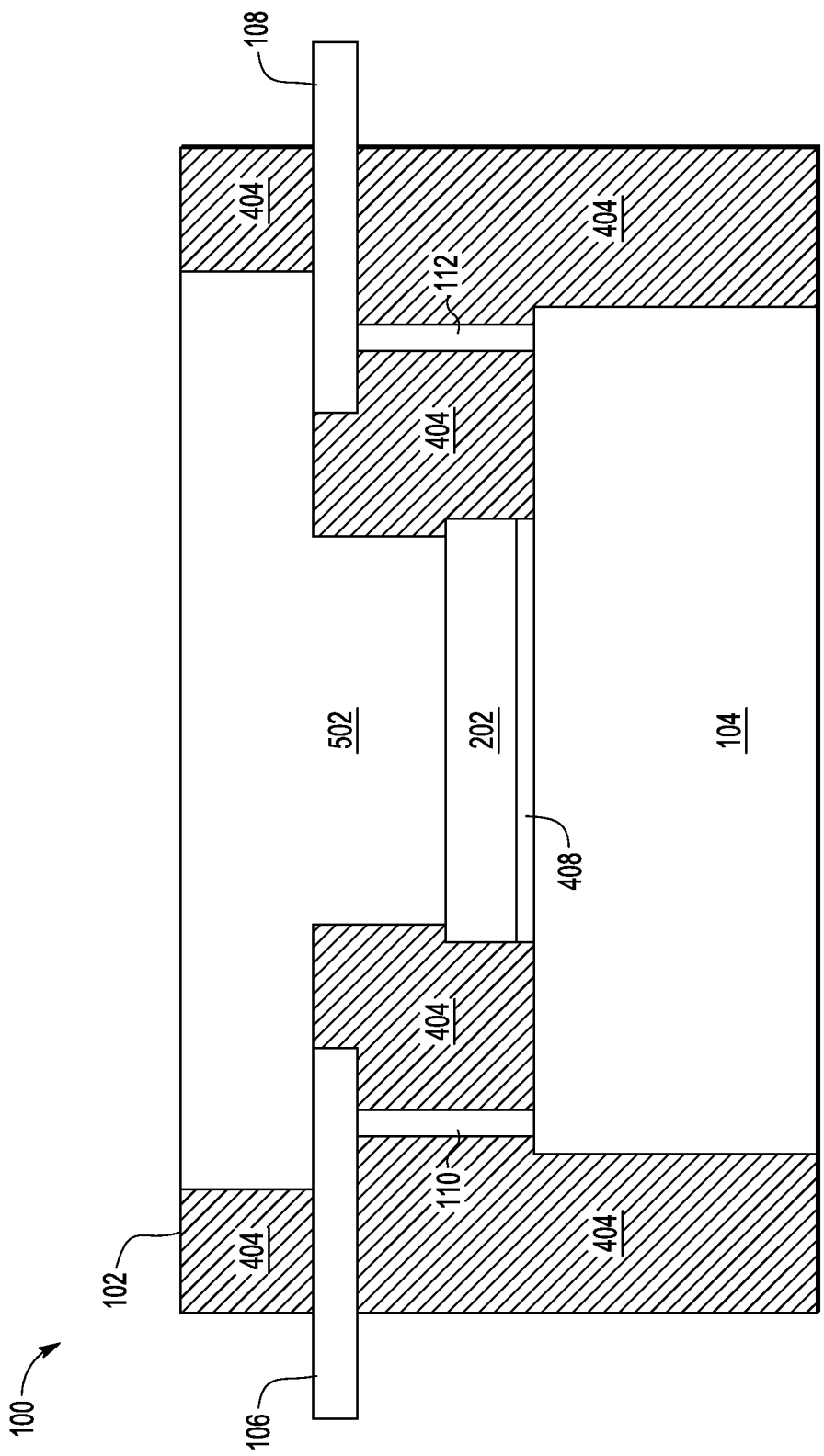

FIG. 5 illustrates, in a simplified cross-sectional view, a subsequent stage of manufacture of packaged semiconductor device 100, including air cavity 502 above semiconductor die 202. The FAM tool 302 is retracted from the mold cavity 102 and film 304 with conformed film portion 402 are removed, leaving air cavity 502 above semiconductor die 202 and portions of leads 106 and 108 exposed.

Figure 6:
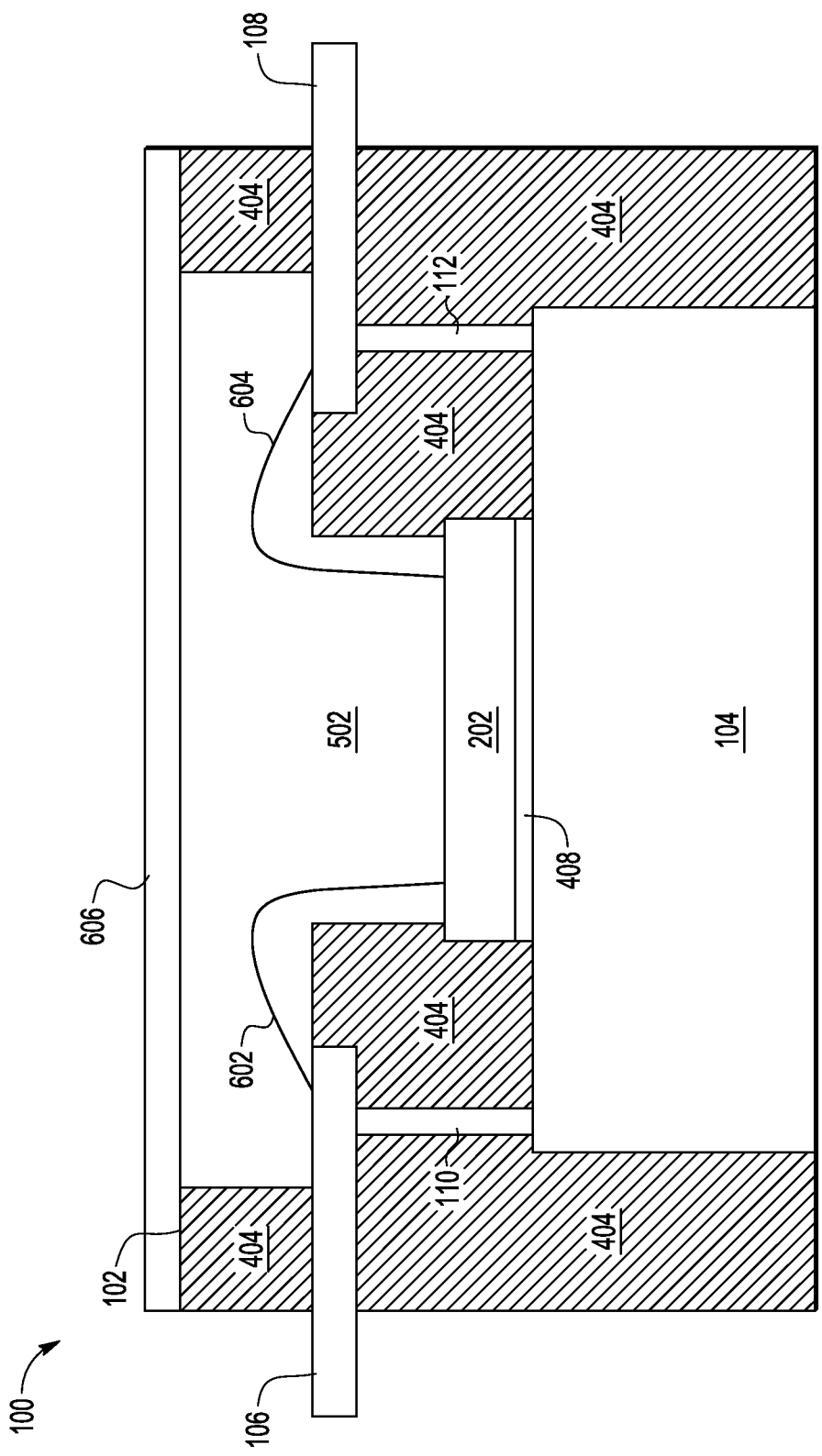

FIG. 6 illustrates, in a simplified cross-sectional view, a subsequent stage of manufacture of packaged semiconductor device 100, including wire bonds 602 and 604, and attached lid 606. Wire bonds are formed between locations on the semiconductor die 202 and leads 106 and 108. The locations on the semiconductor die may include bond pads (not shown) and may be formed of any suitable metal such as aluminum, copper, silver, nickel, or the like for example. The leads 106 and 108 may be formed of any suitable electrically conductive material, such as aluminum, copper, nickel, or iron, or alloys including one or more of these materials, such as copper-194 for example. Wire bond regions of leads 106 and 108 may be bare, or may be plated with any suitable metal such as Ag, Ni, NiPd, NiPdAu, for example. Bond wires electrically couple locations on the semiconductor die 202 to the leads 106 and 108, forming wire bonds. The bond wires may be formed of a metal comprising aluminum, copper, silver, or gold. The bond wires may be attached to the locations on semiconductor die 202 and the leads 106 and 108 with either ball bonds or wedge bonds or a combination of ball bonds and wedge bonds. For example, ball bonds may be used to attach a first end of bond wires to bond pads on the semiconductor die 202 and wedge bonds may be used to attach the opposite ends of bond wires to the leads 106 and 108.

Still referring to FIG. 6, the lid 606 is attached over the air cavity 502. The lid 606 may serve to further protect the semiconductor die 202. Lid 606 may be formed of any suitable material such as plastic, ceramic, glass, metal, and the like. Lid 606 may be attached with any suitable adhesive material at interfaces formed with mold compound 404. For example, lid 606 may be attached over the air cavity 502 using an epoxy material at interfaces with mold compound 404. The lid 606 may also be ultrasonically joined with mold compound 404, in a similar manner as multilayer liquid crystal polymer (LCP) materials are joined. In this embodiment, with lid 606 attached, a hermetic seal is formed over cavity 502. In some embodiments, the lid 606 may include one or more small openings or holes to allow air to pass through it which is especially useful for enclosing a pressure sensor, for example. In some embodiments, lid 606 may be formed as a diaphragm to accommodate one or more sensors included on semiconductor die 202.

By now, it should be appreciated that an efficient semiconductor device packaging process has been provided that includes using a film-assisted molding technique to create an air cavity on top of a semiconductor die, and concurrently, providing heat and pressure for a sintering die attach process. The efficient semiconductor device packaging process enables a sintered die attach and air cavity formation in a single process step.

Generally, there is provided, a method of manufacturing a packaged semiconductor device including forming an assembly by placing a semiconductor die over a substrate with a die attach material between the semiconductor die and the substrate; contacting with a conformal structure at least a portion of a top surface of the semiconductor die, the conformal structure including a pressure transmissive material; applying a pressure to the conformal structure, the pressure transmitted to the top surface of the semiconductor die by the pressure transmissive material; while applying the pressure: encapsulating the assembly with a molding compound, wherein the at least a portion of the top surface of the semiconductor die contacted by the conformal structure is not encapsulated with molding compound; and exposing the assembly to a temperature that is sufficient to cause the die attach material to sinter. The assembly may further include a conductive lead, wherein contacting with a conformal structure further includes contacting a portion of the conductive lead, and wherein encapsulating the assembly with a molding compound further includes the portion of the conductive lead contacted by the conformal structure is not encapsulated with molding compound. The method may further include removing the conformal structure forming an air cavity above the semiconductor die. The method may further include after forming the air cavity above the semiconductor die, forming a wire bond between a location on the semiconductor die and the conductive lead. The method may further include attaching a lid over the air cavity formed above the semiconductor die. At least a portion of the bottom side of the substrate may be exposed after encapsulating the assembly. The substrate may include a metal material and wherein the substrate may be configured for dissipating heat. The die attach material may include a silver (Ag) material, and may be applied to the substrate in the form of a paste. The die attach material may include a silver (Ag) material, and may be applied in the form of a film or tape to a bottom surface of the semiconductor die. The method may further include supporting the conductive lead with a staking structure. The method may further include supporting the conductive lead with a retractable staking pin, the retractable staking pin retracted during encapsulating the assembly with a molding compound.

In another embodiment, there is provided, a method of manufacturing a packaged semiconductor device including: forming an assembly including: a substrate having a top surface and a bottom surface, a semiconductor die over the substrate with a die attach material between the semiconductor die and the top surface of the substrate, and a conductive lead separate from the semiconductor die; contacting with a conformal film at least a portion of a top surface of the semiconductor die, the conformal film including a pressure transmissive material; applying a pressure to the conformal film, the pressure transmitted to the top surface of the semiconductor die by the pressure transmissive material; while applying the pressure: encapsulating the assembly with a molding compound, wherein the at least a portion of the top surface of the semiconductor die contacted by the conformal structure is not encapsulated with molding compound; and exposing the assembly to a temperature that is sufficient to cause the die attach material to sinter. The method may further include forming an air cavity above the semiconductor die, and after forming the air cavity forming a wire bond between a location on the semiconductor die and the conductive lead. The method may further include attaching a lid over the air cavity formed above the semiconductor die. At least a portion of the bottom side of the substrate may be exposed after encapsulating the assembly. The substrate may include a metal material and wherein the substrate may be configured for dissipating heat. The die attach material may include a silver (Ag) material.

In yet another embodiment, there is provided, a packaged semiconductor device including: an assembly including: a substrate having a top surface and a bottom surface, a semiconductor die over the substrate with a sintered die attach material formed between the semiconductor die and the top surface of the substrate, and a conductive lead separate from the semiconductor die; an encapsulant encapsulating a portion of the assembly; a cavity formed in the encapsulant above at least a portion of the semiconductor die, the cavity formed concurrently with the sintered die attach material; and a lid attached over the cavity. The sintered die attach material may include a silver (Ag)

material. At least a portion of the bottom surface of the substrate may be exposed after encapsulating the assembly.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
    an assembly including:
        a substrate having a top surface and a bottom surface,
        a semiconductor die over the substrate with a sintered die attach material formed between the semiconductor die and the top surface of the substrate, and
        a conductive lead separate from the semiconductor die;
    an encapsulant encapsulating a portion of the assembly;
    a cavity formed in the encapsulant above at least a portion of the semiconductor die, the cavity formed concurrently with the sintered die attach material;
    a lid attached over the cavity, wherein the cavity exposes the conductive lead that is separate from the semiconductor die and is defined only by the lid attached over the cavity, the conductive lead, the semiconductor die, and the encapsulant, wherein the encapsulant overlaps a top portion of the semiconductor die.

2. The packaged semiconductor device of claim 1, wherein the sintered die attach material includes a silver (Ag) material.

3. The packaged semiconductor device of claim 1, wherein at least a portion of the bottom surface of the substrate is exposed after encapsulating the assembly.

4. The packaged semiconductor device of claim 1, wherein the substrate comprises a metal material and wherein the substrate is configured for dissipating heat.

5. The packaged semiconductor device of claim 1, wherein the lid attached over the cavity comprises a material selected from the group of plastic, ceramic, glass, and metal materials.

6. The packaged semiconductor device of claim 1, wherein the lid attached over the cavity forms a hermetic seal over the semiconductor die.

7. A packaged semiconductor device comprising:
    an assembly including:
        a substrate having a top surface and a bottom surface,
        a semiconductor die over the substrate with a sintered die attach material formed between the semiconductor die and the top surface of the substrate, and
        a conductive lead separate from the semiconductor die;
    an encapsulant encapsulating a portion of the assembly, at least a portion of the top surface of the semiconductor die and a portion of the conductive lead not encapsulated by the encapsulant;
    an air cavity formed in the encapsulant above at least a portion of the semiconductor die, the air cavity formed concurrently with the sintered die attach material;
    a wire bond formed between a location on the semiconductor die and the conductive lead;
    a lid attached over the air cavity; wherein the air cavity exposes the conductive lead that is separate from the semiconductor die and is defined only by the lid attached over the cavity, the conductive lead, the semiconductor die, and the encapsulant wherein the encapsulant overlaps a top portion of the semiconductor die.

8. The packaged semiconductor device of claim 7, wherein the sintered die attach material comprises a silver (Ag) material.

9. The packaged semiconductor device of claim 7, wherein at least a portion of the bottom surface of the substrate is exposed after the portion of the assembly is encapsulated.

10. The packaged semiconductor device of claim 7, wherein the substrate comprises a metal material and wherein the substrate is configured for dissipating heat.

11. The packaged semiconductor device of claim 7, wherein the lid attached over the cavity comprises a ceramic material.

12. The packaged semiconductor device of claim 7, wherein the lid attached over the cavity forms a hermetic seal over the semiconductor die.

13. A packaged semiconductor device comprising:
    an assembly including:
        a substrate having a top surface and a bottom surface,
        a semiconductor die attached to the substrate with a sintered die attach material formed between the semiconductor die and the top surface of the substrate, and
        a conductive lead separate from the semiconductor die, the conductive lead electrically coupled to a location on the semiconductor die;
    an encapsulant encapsulating a portion of the assembly, at least a portion of the top surface of the semiconductor die and a portion of the conductive lead not encapsulated by the encapsulant;
    an air cavity formed in the encapsulant above at least a portion of the semiconductor die, the air cavity formed concurrently with the sintered die attach material; and
    a lid attached over the air cavity; wherein the air cavity exposes the conductive lead and is defined only by the lid attached over the cavity, the conductive lead, the semiconductor die, and the encapsulant, wherein the encapsulant overlaps a top portion of the semiconductor die.

14. The packaged semiconductor device of claim 13, wherein at least a portion of the bottom side of the substrate is exposed after the portion of the assembly is encapsulated.

15. The packaged semiconductor device of claim 13, wherein the substrate comprises a metal material and wherein the substrate is configured for dissipating heat.

16. The packaged semiconductor device of claim 13, wherein the sintered die attach material comprises a silver (Ag) material.

17. The packaged semiconductor device of claim 13, wherein the lid attached over the air cavity comprises a material selected from the group of plastic, ceramic, glass, and metal materials.

* * * * *